United States Patent
Han et al.

(10) Patent No.: US 6,808,117 B2
(45) Date of Patent: Oct. 26, 2004

(54) METHOD AND APPARATUS FOR CALIBRATING MARKING POSITION IN CHIP SCALE MARKER

(75) Inventors: You-hie Han, Daejon (KR); Choong-shin Lee, Kyungki-do (KR); Yang-ghi Min, Kyungki-do (KR); Byoung-min Ahn, Jeonrabuk-do (KR); Hyeyg-jeon Chang, Seoul (KR)

(73) Assignee: EO Technics Co., Ltd., Anyang (KR)

( * ) Notice: Subject to any disclaimer, the term of this patent is extended or adjusted under 35 U.S.C. 154(b) by 46 days.

(21) Appl. No.: 10/138,257

(22) Filed: May 6, 2002

(65) Prior Publication Data

US 2003/0102292 A1 Jun. 5, 2003

(30) Foreign Application Priority Data

Dec. 1, 2001 (KR) .......................................... 2001-75668

(51) Int. Cl.$^7$ ................................................ G06K 19/06
(52) U.S. Cl. ......................................... 235/494; 235/439
(58) Field of Search ................................. 235/494, 437, 235/438, 439, 474

(56) References Cited

U.S. PATENT DOCUMENTS

| | | | | |
|---|---|---|---|---|
| 5,146,066 A | * | 9/1992 | Brun et al. ................. | 235/380 |
| 5,362,681 A | * | 11/1994 | Roberts, Jr. et al. ........ | 437/226 |
| 5,612,525 A | * | 3/1997 | Apter et al. ................ | 235/375 |
| 5,811,211 A | * | 9/1998 | Tanaka et al. ............... | 430/30 |
| 5,818,018 A | * | 10/1998 | Conboy et al. ............. | 235/375 |
| 6,146,908 A | * | 11/2000 | Falque et al. ............... | 438/11 |

FOREIGN PATENT DOCUMENTS

KR    A-2001-0073297    8/2001

* cited by examiner

*Primary Examiner*—Daniel St. Cyr
(74) *Attorney, Agent, or Firm*—Burns, Doane, Swecker & Mathis, L.L.P.

(57) ABSTRACT

A method and apparatus for calibrating a marking position in a chip scale marker are provided. The method includes: (a) placing a screen which is equivalent in shape to the wafer on a wafer holder for holding the wafer; (b) irradiating a laser beam at a predetermined target point on the screen, and measuring the position of the laser beam by a camera being moved above the target point; (c) transmitting the measured position information to a controller; (d) repeating steps (b) and (c) at a plurality of predetermined points; (e) comparing the transmitted position information with the target point; and (f) calibrating the position of the laser beam irradiated on the wafer by adjusting mirrors of the galvano scanner in the event that a deviation between the position information and the target point falls beyond a predetermined value.

25 Claims, 4 Drawing Sheets

LASER BEAM

METHOD AND APPARATUS FOR CALIBRATING MARKING POSITION IN CHIP SCALE MARKER is application claims priority under 35 U.S.C. §§119 and/or 365 to 2001-75668 filed in Korea on Dec. 1, 2001; the entire content of which is hereby incorporated by reference.

BACKGROUND OF THE INVENTION

1. Field of the Invention

The present invention relates to a method and apparatus for calibrating a marking position in a chip scale marker, and more particularly, to a method and apparatus for calibrating a marking position in a chip scale marker that marks characters on a wafer-chip with a laser.

2. Description of the Related Art

In general, each wafer used in a semiconductor manufacturing process is composed of several thousand to several ten thousand chips. Once chips are completed, a marking process of marking characters and/or numbers is performed on the completed chips so as to classify the chips according to their product lot numbers. At this time, the marking process is performed by a chip scale marker using a laser beam.

FIG. 1 is a schematic view of a general chip scale marker 10, illustrated with a wafer w. Referring to FIG. 1, the wafer w is placed on a wafer holder 20, and a laser 30 is positioned below the wafer holder 20. A laser beam is oscillated from a laser source of the laser 30, irradiated on chips on the wafer w via a plurality of mirrors (not shown) of a galvano scanner 32 and an f-theta lens 34, and finally marks as characters on the chips.

Above the wafer holder 20, a camera 40 is positioned for monitoring an object held by the wafer holder 20. The camera 40 is connected to an X-Y stage 50 and moves with the X-Y stage 50. Here, reference numeral '60' denotes a table on which the X-Y stage 50 and the wafer holder 20 are placed.

To perform a marking process precisely on the chips on a wafer, wafer alignment has to be precisely accomplished. Here, wafer alignment means positioning a wafer at a marking position according to geometrical characteristics of the wafer or a recognition part. A marking process is performed by recognizing the recognition characteristics of a wafer, such as a ball array or a recognition mark, by optical methods, and irradiating a laser beam at the marking position using a suitable optical system. At this time, recognition of the exact chip position and precise laser beam irradiation are required to perform the marking process on a chip of less than 1 mm$^2$. However, even if the aforementioned conditions are satisfied, the irradiated position of a laser beam may gradually change due to external conditions such as vibration and heat. Therefore, there is a need to periodically check this change and calibrate the laser beam irradiation position if necessary. Although the period of measuring and calibrating the marking position varies according to the type of tools used and working conditions, it is necessary to periodically and conveniently check if a laser beam is irradiated at a desired position.

FIG. 2 is a diagram explaining a conventional method of measuring marking errors. Conventionally, a laser beam is irradiated on a wafer-type plate 70 in which a plurality of holes 70a having a diameter of 0.3 mm are formed, and then the position of the laser beam, which passed through these holes 70a, is detected by a camera 40 so as to compare the position of the laser beam with a desired position thereof. Next, the irradiation path of the laser beam is calibrated based on the detected difference between the detected position and the desired position.

However, this conventional method is disadvantageous in that a laser beam passing through the holes 70a is monitored via a front glass 42 of the camera 40. The laser beam is irradiated at an inclination with respect to the hole 70a as indicated with the dotted line in FIG. 2 and, thus, refracted at the front glass 42 of the camera 40. For this reason, it is difficult to detect the exact irradiation position of the laser beam at the plate 70 that is placed at the same position as a wafer.

SUMMARY OF THE INVENTION

To solve the above-described problems, it is a first object of the present invention to provide a method of calibrating a marking position in a chip scale marker, by irradiating a laser beam on a semi-transparent screen rather than a wafer, detecting the irradiated position and calibrating the marking position.

It is a second object of the present invention to provide an apparatus for calibrating a marking position in a chip scale marker for the above-mentioned method.

To achieve an aspect of the first object, there is provided a method of calibrating a marking position in a chip scale marker which performs a marking process by irradiating a laser beam from a laser source on a wafer via a galvano scanner and an f-theta lens, including: (a) placing a screen which is equivalent in shape to the wafer on a wafer holder for holding the wafer; (b) irradiating a laser beam at a predetermined target point on the screen, and measuring the position of the laser beam by a camera being moved above the target point; (c) transmitting the measured position information to a controller; (d) repeating steps (b) and (c) at a plurality of predetermined points; (e) comparing the transmitted position information with the target point; and (f) calibrating the position of the laser beam irradiated on the wafer by adjusting mirrors of the galvano scanner in the event that a deviation between the position information and the target point falls beyond a predetermined value.

To achieve another aspect of the first object, there is provided a method of calibrating a marking position in a chip scale marker which performs a marking process by irradiating a laser beam from a laser source on a wafer via a galvano scanner and an f-theta lens, including: (a) unloading the wafer from a wafer holder; (b) positioning a camera screen at the front of a camera for measuring a beam position; (c) moving the camera and the camera screen to a predetermined target point; (d) irradiating a laser beam at the target point and measuring the position of the laser beam irradiated on the camera screen; (e) transmitting the measured position information to a controller; (f) repeating steps (c) to (e) at several predetermined points: (g) comparing the transmitted position with the target point; and (h) calibrating the position of the laser beam irradiated on the wafer by adjusting the position of mirrors of the galvano scanner in the event that a deviation between the position and the target point is beyond a predetermined value.

To achieve the second object, there is provided an apparatus for calibrating a marking point in a chip scale marker having wafer marking laser, a wafer holder for holding a wafer, and a camera moving while connected to an X-Y stage above the wafer holder and measuring an object held by the wafer holder. The apparatus includes a screen; and a controller for receiving information regarding the position of a laser beam irradiated on the screen and for calibrating the position of mirrors of a galvano scanner of the wafer marking laser in the event that a deviation between the laser beam position and a target point is beyond a predetermined value.

Preferably, the screen is equivalent in shape to the wafer, and the screen, on which a laser beam from the laser is irradiated and a beam point is marked, is placed on the wafer holder.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
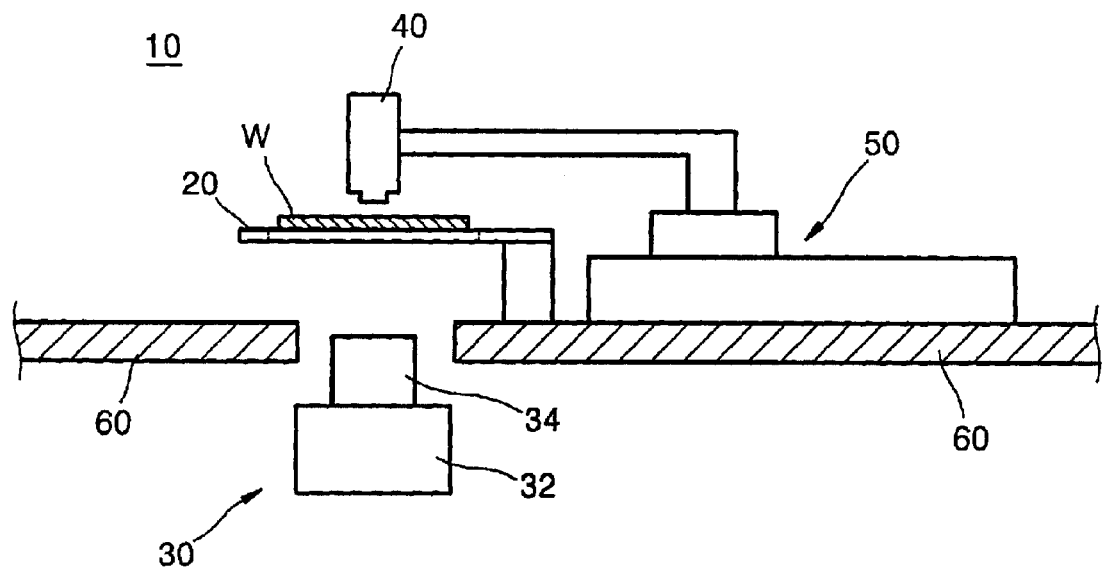
FIG. 1 is a schematic view of a general chip scale marker.
Figure 2:
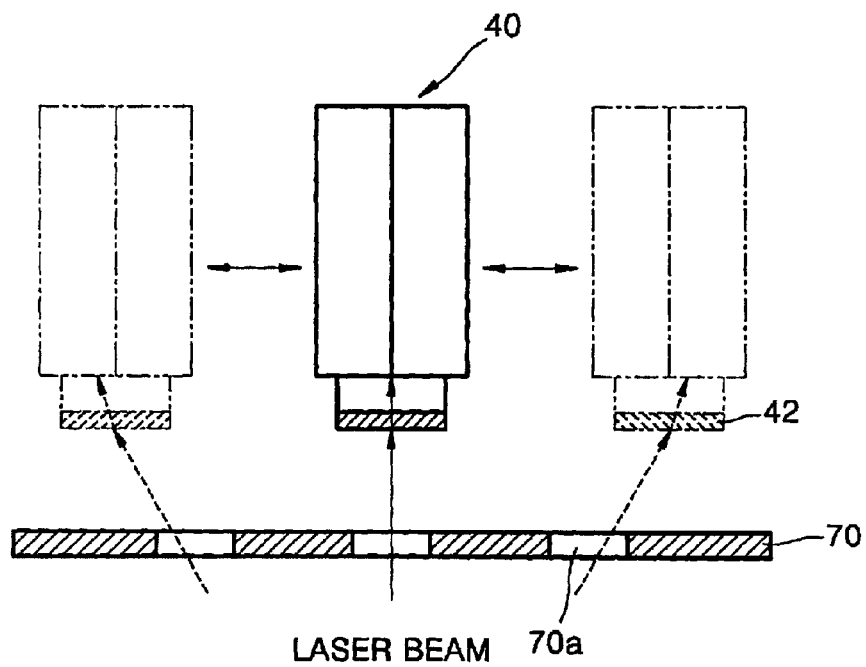
FIG. 2 is a diagram explaining a conventional method of measuring marking errors.

Hereinafter, a first embodiment of an apparatus for calibrating a marking position in a chip scale marker according to the present invention will be described in detail with reference to the accompanying drawings. In the drawings, the thickness of layers or regions is exaggerated for clarity.

Figure 3:
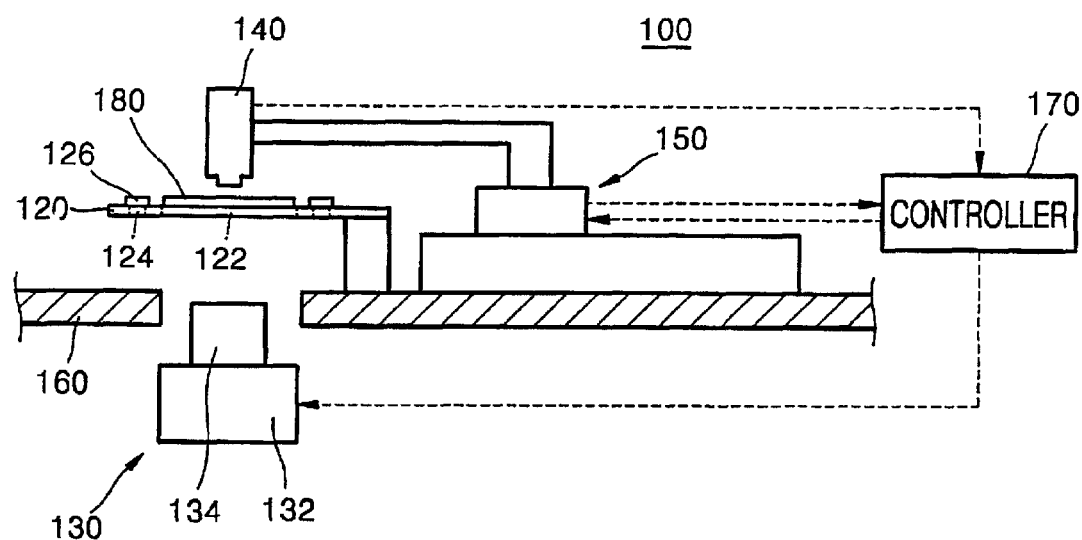
FIG. 3 is a schematic view of a first embodiment of an apparatus for calibrating marking position in a chip scale marker according to the present invention.

FIG. 3 is a schematic view of a first embodiment of an apparatus for calibrating a marking position in a chip scale marker according to the present invention. Referring to FIG. 3, a screen 180 is placed on a wafer holder 120, and a laser 130 is positioned below the wafer holder 120. To mark a corresponding product lot number on a wafer, a laser beam is oscillated from a laser source of the laser 130 and irradiated on the wafer via a plurality of mirrors (not shown) of a galvano scanner 132 and an f-theta lens 134. Installed above the wafer holder 120 is a camera 140 for observing the wafer or the screen 180. The camera 140 is moved and held by an X-Y stage 150. The position measured by the camera 140 and the X-Y stage 150 is input to a controller 170 as an electrical signal, and a signal output from the controller 170 is transmitted to the galvano scanner 132 and the X-Y stage 150.

Figure 4:
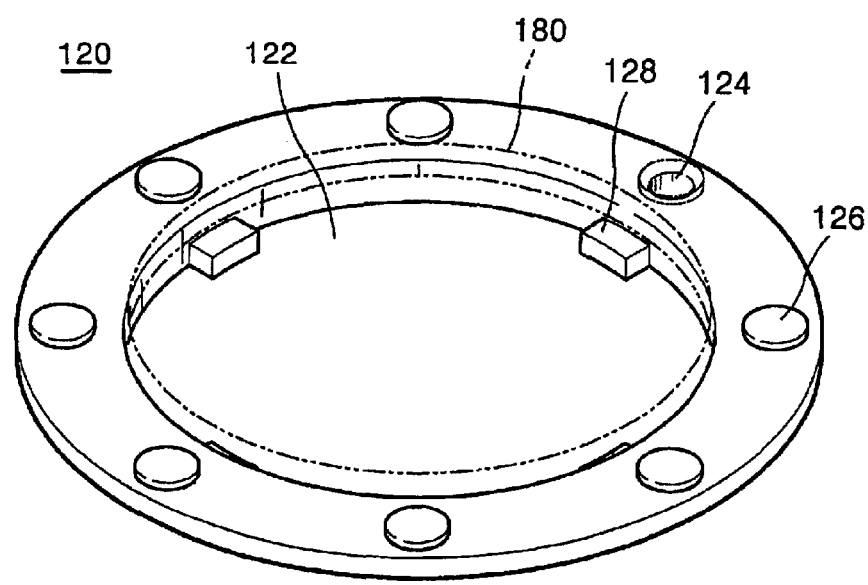
FIG. 4 is a perspective view of a wafer holder and a screen of FIG. 3.
Figure 5:
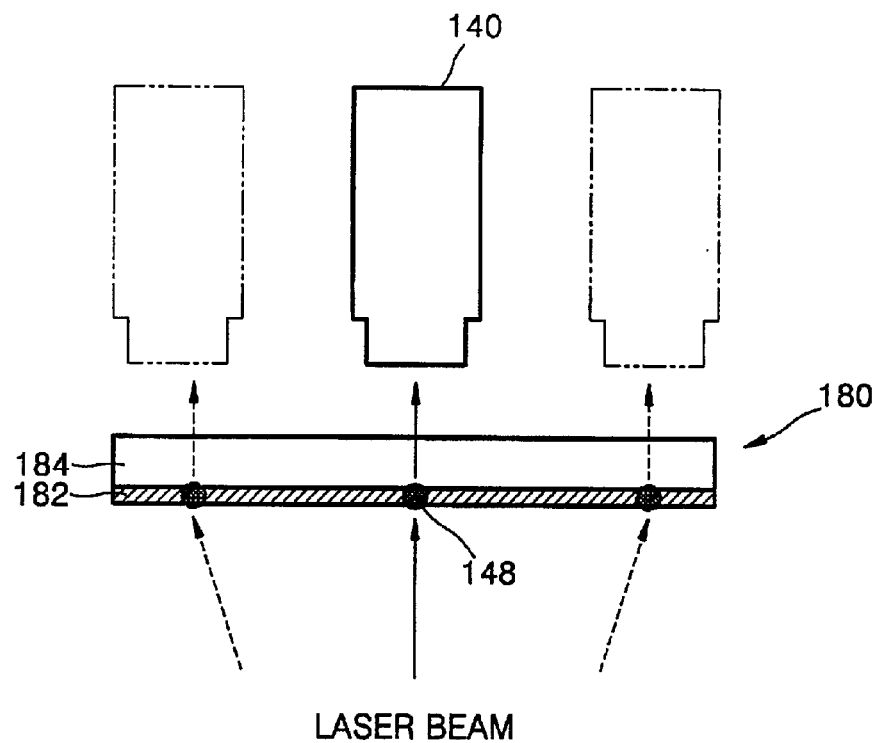
FIG. 5 is a diagram showing the light path from the irradiated point on a screen by a laser.

The screen 180 on which a marking process is to be performed is equivalent in shape to a wafer, and is composed of two layers as shown in FIG. 5. In detail, a lower layer 182 is a fluorescent layer that absorbs a laser beam and emits light, and an upper layer 184 is a layer that passes the light emitted by the lower layer 182. Preferably, the lower layer 182 is formed of a rigid material so that it does not transform even when positioned in a central hole 122 of the wafer holder 120 illustrated in FIG. 4.

FIG. 4 is a perspective view of the wafer holder 120, illustrated together with a screen 180. The wafer holder 120 has the central hole 122 at the center and a plurality of protrusions 128 that hold the wafer within the inner circumference of the wafer holder 120. A plurality of holes 124 are formed around the central hole 122 and are each covered with a semi-translucent layer 126 capable of partially transmitting light. Preferably, these holes 124 are aligned to form a concentric circle a predetermined distance away from the inner circumference of the wafer holder 120. Here, the semi-translucent layer 126 functions as the screen 180.

Hereinafter, the operations of an apparatus for calibrating a marking position in the chip scale marker 100 having the above composition will be described in detail with reference to the drawings.

Figure 6:
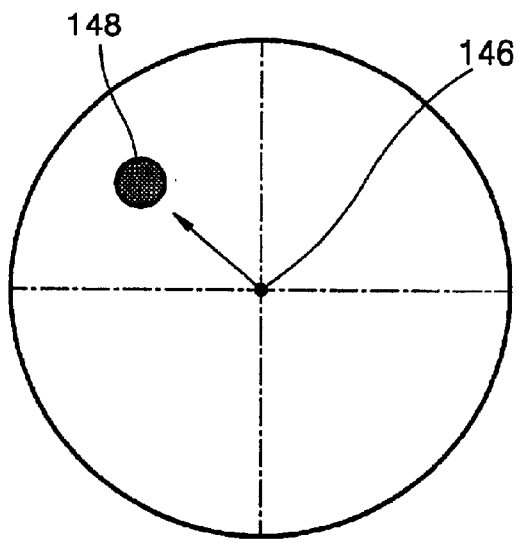
FIG. 6 is a schematic view of the center point of a camera and a laser beam point that deviates from the center point.

FIG. 5 is a diagram showing the path of light when a laser beam is irradiated on a screen 180, and FIG. 6 is a diagram of the center point 146 of a camera and a laser beam point 148 that deviates from the center point.

First, referring to FIGS. 3 and 5, the screen 180, which is equivalent in shape to a wafer, is placed on the wafer holder 120. Then, when light is oscillated from the laser 130, it is irradiated on a predetermined point of the screen 180 via a plurality of mirrors of the galvano scanner 132. The irradiated light is absorbed by the lower layer 182, which is a fluorescent layer, and then radiated. Thereafter, the radiated light is irradiated upward via the upper layer 184. At this time, as shown in FIG. 5, light with an inclined angle of incidence to the screen 180 as indicated by the dotted lines, is irradiated perpendicularly to the camera 140, following the path of light indicated by the dotted lines. Preferably, the laser 130 is a Nd:YAG laser, which emits infrared light having a wavelength of 1064 nm, green light having a wavelength of 532 nm, which is a second harmonic wave, and ultraviolet light having a wavelength of 355 nm which is a third harmonic wave. Also, preferably, the camera 140 is a vision CCD camera capable of checking the wavelength of a laser beam.

The camera 140 is moved to be positioned above a desired point of a laser beam, i.e., the center point 146 of the camera 140, by the X-Y stage 150, and then reads a laser beam point 148 formed on the screen 180 below the camera 140. At this time, the camera 140 checks how much the beam point 148 deviates from the center point 146, and inputs X-Y coordinates of the deviation to the controller 170. This checking is repeated at several positions.

Then, the controller 170 analyses the input X-Y coordinates of the deviation, and adjusts the mirrors of the galvano scanner 132 to calibrate the path of light in the event that the deviation is beyond a predetermined range.

Next, the screen 180 is taken away from the wafer holder 120, and then a wafer is placed on the wafer holder 120. At this time, the position of the wafer is the same as the position of the screen 180.

The laser beam oscillated from the laser 130 is irradiated to marks characters on the wafer, following the calibrated path of light.

During the laser marking, it is possible to detect the vibration of the galvano scanner 132. More specifically, a laser beam is irradiated over the semi-translucent layer 126 covering the hole 124 of the wafer holder 120, the camera is moved above a target point on which the laser beam is to be irradiated, and then the irradiated beam point is detected and calibrated, if necessary, as described above.

Preferably, the screen 126 and 180 is formed of a glass or acryl that is processed to have a rough surface on which a laser beam is irradiated, and a photo attenuator, which is attached on the top of the glass or acryl. When a laser beam is irradiated at a point on the screen 180, the laser beam is scattered by the rough surface of the screen 180. In this case, although the laser beam is irradiated on the screen 180 at an angle, the laser beam is scattered and not transmitted to the camera 140 with an inclined angle of incidence. The irradiated laser beam forms an image on the lower layer 182. Also, the photo attenuator can be installed on the lower layer in order to detect a laser beam point from the scattered beams on the lower layer. The light passing through the photo attenuator has only one beam point, and therefore the beam point can be easily measured using the camera 140.

A two-layered screen is adopted in this embodiment, but a single-layered screen is sufficient in the case that the screen is formed of a rigid material such as semi-translucent glass.

Figure 7:
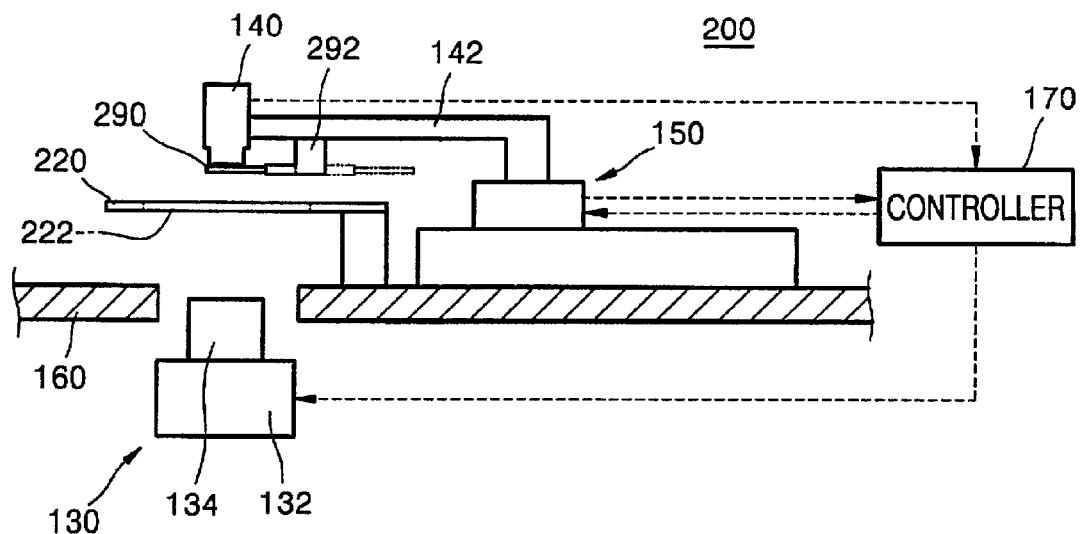
FIG. 7 is a schematic view of a second embodiment of an apparatus for calibrating marking position in a chip scale marker.

FIG. 7 is a schematic view of a second embodiment of an apparatus for calibrating a marking position in a chip scale marker 200 according to the present invention. Here, the same elements as those in the first embodiment are described with the same reference numerals, and their detailed descriptions are omitted.

Referring to FIG. 7, a motor 292 is attached to the bottom of a support 142 for holding a camera 140 so as to install or detach the camera screen 290 at or from the front of a camera 140. The wafer holder 220 has a central hole 222 through which a laser beam is irradiated on the camera screen 290 from a laser 130.

To measure a marking position by the camera screen 290, the camera screen 290 is positioned at the front of the camera 140 by actuating the motor 292. Next, an X-Y stage 150 is actuated to move the camera 140 and the camera screen 290 to a predetermined position, and then a laser beam is irradiated onto the camera screen 290. Then, the irradiated beam point is measured by the camera 140, and the position information of the beam point is input to a controller 170.

Figure 8:
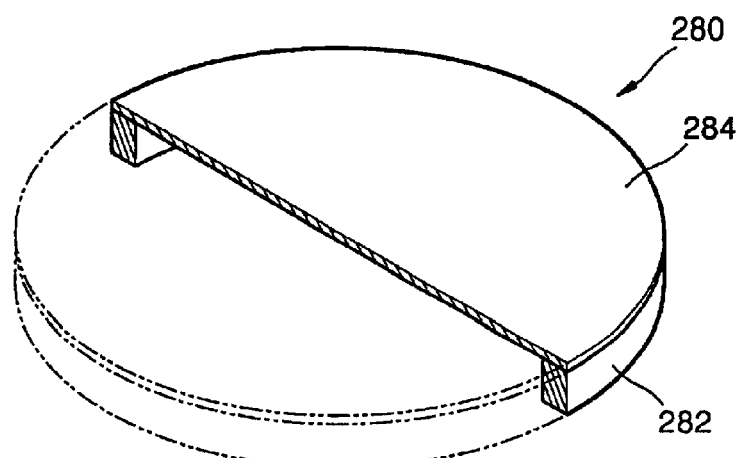
FIG. 8 is a partially cutaway perspective view of another embodiment of a screen according to the present invention.

FIG. 8 is a partially cutaway perspective view of another embodiment of a screen according to the present invention. Here, the screen is made by attaching a semi-translucent layer 284 to a round frame 282. The semi-translucent layer 284 may be formed of tracing paper, for example. Such a semi-translucent layer 284 indicates a point where the laser beam is irradiated.

As described above, in a method and apparatus for calibrating a marking position in a chip scale marker, according to the present invention, a marking position is measured and the direction of a laser beam is calibrated before marking characters and/or numbers on a wafer. During a marking process, the position of a laser beam can be easily adjusted by irradiating the laser beam on a semi-translucent layer formed at the edge of a wafer holder, measuring the irradiated laser beam point, and calibrating a marking position. Further, since the calibration of a marking position is performed directly on a beam point irradiated on a screen, the marking position can be precisely calibrated, thereby performing a marking process at the desired position of a wafer chip.

While this invention has been particularly described with reference to preferred embodiments thereof, it will be understood by those skilled in the art that various changes in form and details may be made therein without departing from the spirit and scope of the invention as defined by the appended claims.

What is claimed is:

1. A method for calibrating a marking position in a chip scale marker that performs a marking process by irradiating a laser beam from a laser source on a wafer via a galvano scanner and an f-theta lens, the method comprising:

(a) placing a screen which is equivalent in shape to the wafer on a wafer holder for holding the wafer;

(b) irradiating a laser beam at a predetermined target point on the screen, and measuring the position of the laser beam by a camera being moved above the target point;

(c) transmitting the measured position information to a controller;

(d) repeating steps (b) and (c) at a plurality of predetermined points;

(e) comparing the transmitted position information with the target point; and (f) calibrating the position of the laser beam irradiated on the wafer by adjusting mirrors of the galvano scanner in the event that a deviation between the position information and the target point falls beyond a predetermined value.

2. The method of claim 1, wherein the screen absorbs the laser beam and emits light upward perpendicularly to the screen.

3. The method of claim 1, wherein the screen comprises:

a lower layer formed of a glass or acryl layer that is processed to have one rough surface on which an irradiated laser beam is scattered at a laser beam point; and a photo attenuator for filtering the scattered beam and providing a laser beam point upward.

4. The method of claim 1, wherein the screen comprises a semi-translucent layer on which the laser beam point is marked.

5. The method of claim 1, wherein the laser beam comprises an Nd:YAG laser which emits infrared light having a wavelength of 1,064 nm, green light; having a wavelength of 532 nm, which is a second harmonic wave, and ultraviolet light having a wavelength of 355 nm which is a third harmonic wave.

6. The method of claim 1 further comprising, performing a marking process on a wafer that placed on the wafer holder.

7. The method of claim 6, further comprising calibrating a marking position during performing a marking process on the wafer.

8. The method of claim 7, wherein calibrating a marking position comprises:

(g1) irradiating a laser beam at a predetermined target point of a semi-transparent layer on a hole formed around a central hole in the wafer holder and measuring the position of the laser beam irradiated on the semi-translucent layer using the camera positioned above the target point;

(g2) transmitting the measured position information to the controller;

(g3) repeating steps (g 1) and (g2) for a plurality of holes in the wafer holder (g4) comparing the transmitted position information with the target point of the semi-translucent layer; and (g5) calibrating the .position of a laser beam irradiated on the wafer by adjusting the position of mirrors of the galvano scanner in the event that a deviation between the position information and the target point is beyond a predetermined value.

9. The method of claim 8, wherein the screen absorbs the laser beam and emits light upward perpendicularly to the screen.

10. The method of claim 8, wherein the semi-translucent layer comprises:
- a lower layer formed of a glass or acryl layer that is processed to have one rough surface on which an irradiated laser beam is scattered at a laser beam point; and
- a photo attenuator for filtering the scattered beam, and providing a laser beam point on the lower layer.

11. The method of claim 8, wherein the plurality of holes are formed at regular intervals in a concentric circle, and are a predetermined distance away from the circumference of the central hole of the wafer holder on which the wafer is to be placed.

12. A method of calibrating a marking position in a chip scale marker that performs a marking process by irradiating a laser beam from a laser source on a wafer via a galvano scanner and an f-theta lens, the method comprising:
  (a) unloading the wafer from a wafer holder;
  (b) positioning a camera screen at the front of a camera for measuring a beam position, the camera screen having an end rotatably attached to an X-Y stage;
  (c) moving the camera and the camera screen to a predetermined target point by moving the X-Y stage;
  (d) irradiating a laser beam at the target point and measuring the position of the laser beam irradiated on the camera screen;
  (e) transmitting the measured position information to a controller;
  (f) repeating steps (c) to (e) at several predetermined points:
  (g) comparing the transmitted position with the target point; and
  (h) calibrating the position of the laser beam irradiated on the wafer by adjusting the position of mirrors of the galvano scanner in the event that a deviation between the position and the target point is beyond a predetermined value.

13. The method of claim 12, wherein the screen absorbs the laser beam and emits light upward perpendicularly to the screen.

14. The method of claim 12, wherein the camera screen comprises:
- a lower layer formed of a glass or acryl layer that is processed to have one tough surface on which the laser beam is scattered at a laser beam point; and
- a photo attenuator for filtering the scattered beam, and providing a later beam point upward.

15. The method of claim 12, wherein the camera screen comprises a, semi-translucent layer on which the laser. beam point is marked.

16. The method of claim 12, wherein the laser beam comprises an Nd:YAG laser which emits infrared light having a wavelength of 1,064 nm, green light having a wavelength of 532 nm which is a second harmonic wave, and ultraviolet light having a wavelength of 353 nm, which is a third harmonic wave.

17. An apparatus for calibrating a marking point in a chip scale marker having wafer-marking laser, a wafer holder for holding a wafer, and a camera moving while connected to an X-Y stage above the wafer holder and measuring an object held by the wafer holder, the apparatus comprising:
- a screen which is equivalent in shape to the wafer, and the screen, on which a laser beam from the laser is irradiated and a beam point is marked, is placed on the wafer holder; and
- a controller for receiving information regarding the position of a laser beam irradiated on the screen and for calibrating the position of mirrors of a galvano scanner of the wafer marking laser in the event that a deviation between the laser beam position and a target point is beyond a predetermined value.

18. The apparatus of claim 17, wherein the screen, comprises:
- a lower layer for absorbing an irradiated laser beam; and
- an upper layer deposited on the lower layer, the upper layer for transmitting light passing through the lower layer to the screen.

19. The apparatus of claim 17, wherein the screen comprises:
- a lower layer formed of a glass or acryl layer that is processed to have one rough surface on which an irradiated laser beam is scattered at a laser beam point; and
- a photo attenuator for filtering the scattered beam and providing a laser beam upward.

20. The apparatus of claim 17, wherein the screen comprises a semi-translucent glass.

21. The apparatus of claim 17, wherein in the wafer holder, a plurality of holes are aligned to form a concentric circle and is a predetermined distance away from the circumference of a central hole in which a wafer is a to be placed, and each hole is covered with a semi-translucent layer.

22. An apparatus for calibrating a marking point in a chip scale marker having wafer marking laser, a wafer holder for holding a wafer and a camera moving, while connected to an X-Y stage above holder and measuring an object held by the wafer holder, the apparatus comprising;
- a camera screen an end which is rotatably attached the X-Y stage to be moved to the front of the camera the camera, screen is moved together with the camera to a position by moving the X-Y stage where a laser beam is irradiated from the laser, and the camera screen is a semi-translucent screen on which the laser beam is irradiated and marked; and
- a controller for receiving information regarding the position of a laser beam irradiated on the camera screen and for calibrating the position of mirrors of a galvano scanner of the wafer marking laser in the event that a deviation between the laser beam position and a target point is beyond a predetermined value.

23. The apparatus of claim 22, wherein the camera screen comprises:
- a lower layer for absorbing an irradiated laser beam; and
- an upper layer deposited on the lower layer, the upper layer for transmitting light passing through the lower layer upward perpendicularly to the screen.

24. The apparatus of claim 22, wherein the camera screen comprises:
- a lower layer formed of a glass or acryl layer that is processed to have one rough surface on which an irradiated laser beam is scattered at a laser beam point; and
- a photo attenuator for filtering the scattered beam and providing a laser beam upward.

25. The apparatus of claim 22, wherein the camera screen comprises a semi-translucent glass.

* * * * *